United States Patent [19]

Kitabatake et al.

[11] Patent Number: 5,328,855
[45] Date of Patent: Jul. 12, 1994

[54] FORMATION OF SEMICONDUCTOR DIAMOND

[75] Inventors: Makoto Kitabatake, Nara; Masahiro Deguchi, Hirakata; Takashi Hirao, Moriguchi, all of Japan

[73] Assignee: Matsushita Electric Industrial Co., Ltd., Kadoma, Japan

[21] Appl. No.: 918,961

[22] Filed: Jul. 24, 1992

[30] Foreign Application Priority Data

Jul. 25, 1991 [JP] Japan .................. 3-186079
Jan. 30, 1992 [JP] Japan .................. 4-014614
Jan. 30, 1992 [JP] Japan .................. 4-014615
Feb. 13, 1992 [JP] Japan .................. 4-026483

[51] Int. Cl.$^5$ .................. H01L 21/265; H01L 21/268
[52] U.S. Cl. .................. 437/25; 437/174; 423/446
[58] Field of Search .................. 437/173, 174, 20, 25; 156/DIG. 68, DIG. 80; 423/446

[56] References Cited

U.S. PATENT DOCUMENTS

| | | | |
|---|---|---|---|
| 4,181,538 | 1/1980 | Narayan et al. | 437/174 |
| 4,399,364 | 8/1983 | Evans et al. | 423/446 |
| 4,439,245 | 3/1984 | Wu | 437/174 |
| 4,849,199 | 7/1989 | Pinneo | 156/DIG. 68 |
| 5,002,899 | 3/1991 | Geis et al. | 437/173 |
| 5,066,515 | 11/1991 | Ohsawa | 423/446 |
| 5,114,871 | 5/1992 | Jones | 437/41 |
| 5,176,788 | 1/1993 | Kabacoff et al. | 423/446 |

OTHER PUBLICATIONS

Prins, Johan F., "Activation of boron-dopant atoms in ion-implanted diamonds", Physical Review B, at pp. 5576–5584 (1988) month unknown.

Prins & Gaigher, "A Ten Study of Layers Grown on Copper Using Carbon-Ion-Implantation", New Diamond Science and Technology, at pp. 561–566 (1991).

Sandhu, Swanson and Chu, "Doping of diamond by coimplantation of carbon and boron", App. Phys. Lett. 55 (14), at pp. 1397–1399 (1989) month unknown.

Sandhu, Kao and Swanson, "Doping of Diamond by Co-Implantation With Dopant Atoms and Carbon", Mat. Res. Soc. Symp. Proc., vol. 162, at pp. 321–326 (1990) month unknown.

Sandhu, Liu, Parikh, Hunn & Swanson, "Regrowth of Damaged Layers in Diamond Produced By Ion Implantation", Mat. Res. Soc. Symp. Proc., vol. 162, pp. 189–194 (1990) month unknown.

Lee, Brosious and Corbett, "High-Temperature Ion Implantation in Diamond", Phys. Stat. Sol., vol. 50, at pp. 237–242 (1978) month unknown.

Primary Examiner—Robert Kunemund
Assistant Examiner—Ourmazd S. Ojan
Attorney, Agent, or Firm—Ratner & Prestia

[57] ABSTRACT

Semiconductor diamond is formed by a process comprising irradiating diamond crystal with light having irradiation density of more than 0.1 W/cm$^2$, annihilating defects in the diamond crystals, and cleaning the surface of the diamond crystals.

14 Claims, 5 Drawing Sheets

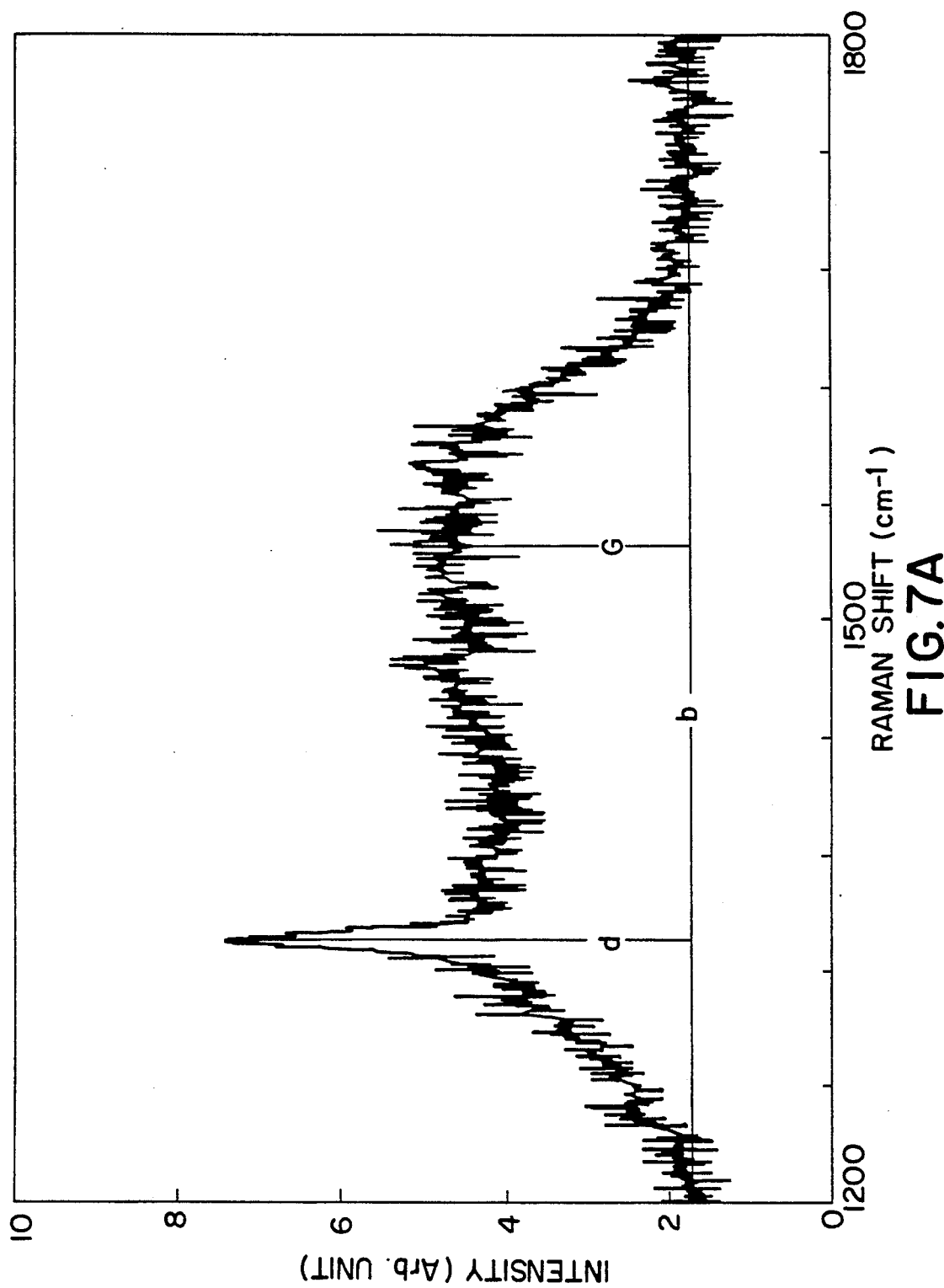

FORMATION OF SEMICONDUCTOR DIAMOND

BACKGROUND OF THE INVENTION

1. Field of the Invention

The present invention relates generally to formation of semiconductor diamond, and particularly to formation of a semiconductor diamond thin film which exhibits a wide band gap, is durable in a hard environment, and usable in high temperature and high power semiconductor devices and blue light emitting diodes in the semiconductor industry and the electronics industry.

2. Description of the Prior Art

In recent years, diamond films have been formed by the CVD method using hydrocarbon (or carbon monoxide) and hydrogen gases. B doped p-type diamond was reported as semiconductor diamond synthesized by CVD and high pressure, high temperature techniques. Nevertheless, n-type semiconductor diamond with sufficiently low resistivity for semiconductor device applications was not achieved.

It is known that diamond crystals usually contain many of defects which prevent semiconductivity. Furthermore, using ion-implantation to fabricate semiconductor diamond introduces many of defects simultaneously in the diamond crystals. Ion implantation with post annealing techniques have been widely used in silicon device technology for doping with the desired ions in a controlled manner. Nevertheless, it is difficult to anneal out the defects in the diamond without graphitizing the diamond. Thermal annealing usually graphitizes damaged regions of the diamond because the more stable configuration of carbon is not diamond, but graphite, at atmospheric pressure and room temperature.

The conventional processes of forming semiconductor diamond are not well suited for deleting the defects in diamond without graphitizing and making semiconducting electronic conductivities.

SUMMARY OF THE INVENTION

The inventors found that by irradiating diamond crystal with light having irradiation density of more than 0.1 W/cm$^2$ and efficiently annihilating defects in the diamond crystals, semiconductor diamond crystals are formed. The inventors further found that by keeping the diamond crystal in an atmosphere of less than $10^{-4}$ Torr, or in an atmosphere filled with inert gas, hydrogen, and/or nitrogen, the defects in the diamond crystal can be annihilated efficiently, and semiconductor diamond can be formed.

One aspect of the present invention is to provide a diamond crystal with low density of defects. A method for formation of semiconductor diamond in accordance with the present invention comprises: irradiating diamond crystal with light having irradiation density of more than 0.1 W/cm$^2$, and annihilating defects in the diamond crystal to form the semiconductor diamond.

Another aspect of the present invention is to provide diamond crystal with a clean surface to enable the formation of diamond semiconductor devices. For this aspect, a method for formation of semiconductor diamond in accordance with the present invention comprises: irradiating diamond crystal with light having irradiation density of more than 0.1 W/cm$^2$, keeping the diamond crystal in an atmosphere including oxygen, and cleaning the surface of the diamond crystal to form the semiconductor diamond.

Still another aspect of the present invention is to provide semiconductor diamond by ion implantation to enable the formation of diamond semiconductor devices. For this use, a method for formation of semiconductor diamond in accordance with the present invention comprises: implanting the dopants in diamond crystal by ion implantation, then irradiating the diamond crystal with light having an irradiation density of more than 0.1 W/cm$^2$ after the ion implantation, and annihilating defects in the diamond crystal to form the semiconductor diamond.

Still another aspect of the present invention is to efficiently annihilate damaged diamond crystal structures during the ion implantation. For this aspect, a method for formation of semiconductor diamond in accordance with the present invention comprises: implanting the dopants in the diamond crystal by ion implantation, irradiating the diamond crystal with light having irradiation density of more than 0.1 W/cm$^2$ simultaneously during the implantation, and annihilating defects in the diamond crystal to form the semiconductor diamond. The inventors further found that by focusing the irradiated light on a small area of the diamond crystal and scanning the light to cover a large area of the diamond crystal, the defects in the ion damaged diamond crystal can be annihilated efficiently, and semiconductor diamond can be formed.

Still another aspect of the present invention is efficient annihilation of damaged diamond crystal structures during ion implantation. For this aspect, a method for formation of semiconductor diamond in accordance with the present invention comprises: implanting the dopants in the diamond crystal by ion implantation, irradiating the diamond crystal with light having an irradiation density of more than 0.1 W/cm$^2$ intermittently during the implantation, and annihilating defects in the diamond crystal to form the semiconductor diamond.

The inventors further found that by using ultraviolet light, laser light, and/or light having at least two different ranges of wavelengths as the irradiated light, and/or by keeping the diamond crystal at a temperature lower than 300° C., the defects in the ion damaged diamond crystal can be annihilated efficiently, and semiconductor diamond can be formed.

The inventors further found that by keeping the amount of the implanted dopants before and/or between the light irradiation less than $10^{16}$ ions/cm$^2$, and keeping the ion energy of the implanted dopants more than 50 eV, and using at least one material selected from group III or group V materials as the implanted dopant, the defects in the ion damaged diamond crystal can be annihilated efficiently and that semiconductor diamond can be formed.

BRIEF DESCRIPTION OF THE DRAWING

FIG. 7A illustrates Raman scattering spectroscopy of the as-deposited diamond crystal thin film deposited by micro-wave CVD.

DETAILED DESCRIPTION OF THE INVENTION

Figure 1:
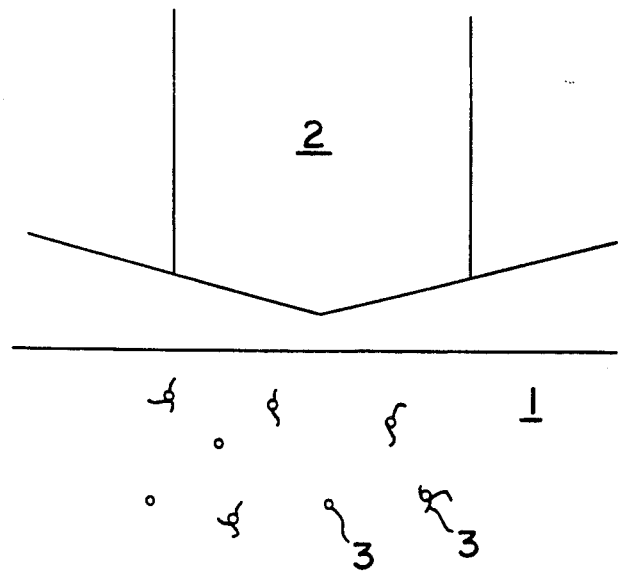
FIG. 1 is a schematic view showing a process in accordance with an exemplary embodiment of the present invention.

A method in accordance with present invention is described with reference to the accompanying drawings. FIG. 1 shows a first embodiment, wherein a diamond crystal 1 was irradiated with light 2 having an irradiation density of more than 0.1 W/cm$^2$, annihilating defects 3 in the diamond crystal 1. Perfect crystalline parts of diamond crystal 1 are transparent throughout a wide range of wavelengths of lights. Nevertheless, defects 3 absorbed lights and colored the diamond crystal. Irradiating light 2 was only absorbed at defects 3 and gave energy to the defects. This energy concentrated in the defects activated the movement of the atoms surrounding the defects which enabled the annihilation of the defects 3. Annihilation of defects decreased the density of the defects in the diamond crystal and enabled formation of semiconductor diamond. It was confirmed that light irradiation was effective when irradiation density of light 2 was more than 0.1 W/cm$^2$. The activation of atom movements was not enough when the irradiated light density was less than 0.1 W/cm$^2$. In the ambient atmosphere, irradiation density of more than 100 W/cm$^2$ resulted in deformation and graphitization of the diamond crystal. It is considered that graphitization is accelerated by oxygen which is included in the ambient atmosphere.

Figure 2:
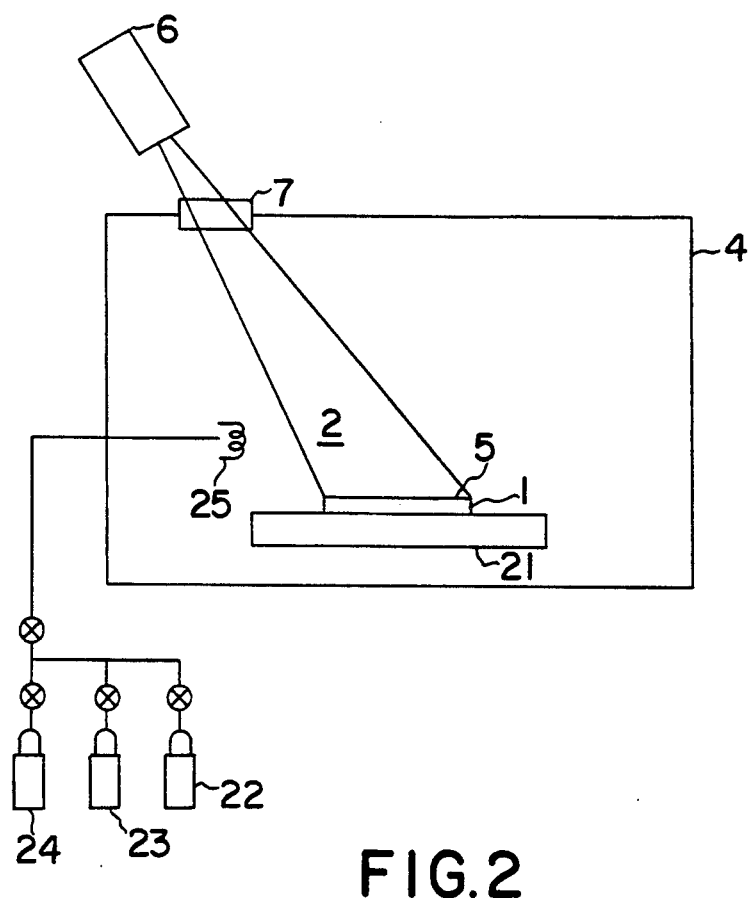
FIG. 2 is a schematic sectional view of an apparatus in accordance with an exemplary embodiment of the present invention.

The inventors further experimentally confirmed that when as shown in FIG. 2 diamond crystal 1 was put in the vacuum chamber 4 which was evacuated to less than 10$^{-4}$ Torr, and when, as also shown in FIG. 2, the vacuum chamber 4 was filled with inert gas 22, hydrogen 23, and/or nitrogen 24, the defects in the diamond crystal 1 were annihilated by light 2 irradiated from a light source 6, such as an eximer lasers through optical window 7 without graphitization of the surface 5. It is considered that inert gas, hydrogen, and nitrogen suppress the reaction between oxygen and the diamond crystal surface; and hydrogen further reacts with the graphite on the surface 5 of the diamond crystal 1 and removes it. Atomic hydrogen has a stronger power to remove the graphite on the surface 5 of diamond crystal 1. Atomic hydrogen was generated by heating the filament 25 up to 2000° C.

It was further confirmed that oxygen sometimes worked as a stronger remover of graphite (non-diamond materials) on the surface of the diamond crystal than atomic hydrogen. Keeping the diamond crystal in an oxygen atmosphere a long time causes graphitization of the surface of the diamond crystal. Nevertheless, a short period of exposure to the oxygen or a short-time heat up of the diamond crystal in the oxygen atmosphere resulted in only removal of the non-diamond materials from the diamond crystal without graphitization of the surface. Light irradiation results in the short-time heat up of the irradiated diamond crystal. Oxygen removes the non-diamond materials from the surface of the diamond crystal, and cleans up the surface of the diamond crystal.

Figure 3:
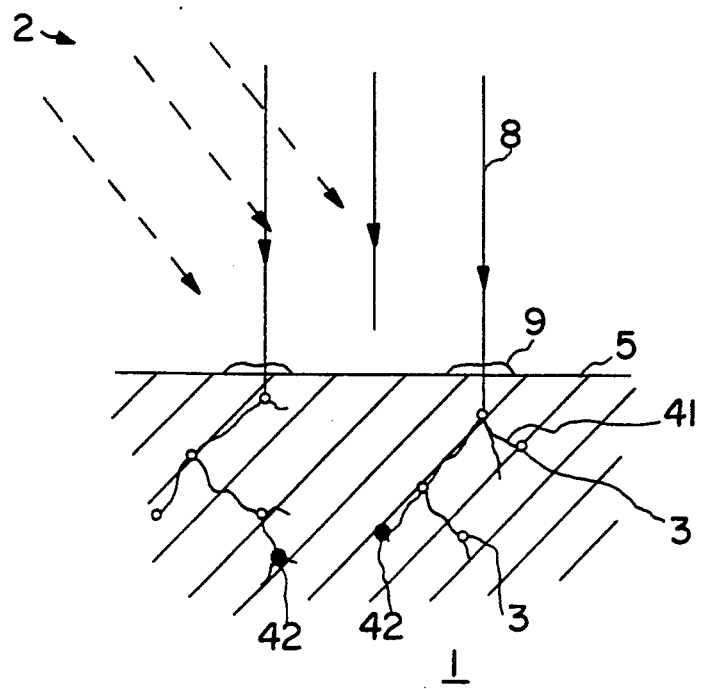
FIG. 3 is a detailed sectional view of an apparatus in accordance with an exemplary embodiment of the present invention.

At first, diamond crystal was implanted with dopant for diamond such as B, P, and N (group III or group V materials) by a conventional ion implanter used in Si semiconductor device mass production; and then the implanted diamond crystal was irradiated with light having an irradiation density of more than 0.1 W/cm$^2$ in another apparatus. The ion implantation introduces the defects 3, which prevent the electrical activation of the dopant, in the diamond crystal lattice by collision cascade 41 of implanted ion 8 as shown in FIG. 3. The ion implantation also forms non-diamond materials 9, which exhibit different electrical conductive characteristics from semiconductor diamond, on the surface 5 of the diamond crystal 1. When the diamond crystal 1 was irradiated by light 2 after the ion implantation, the energy of the light was selectively absorbed by the ion-collision-induced defects 3 in the diamond crystal 1. This activated the atom movements around the defects 3, annihilated the defects 3, displaced the dopant atoms 42 into the lattice substitutional site, and electrically activated the dopants. The light irradiation also removed non-diamond materials 9 from the surface 5 and formed the semiconductor diamond.

Figure 4:
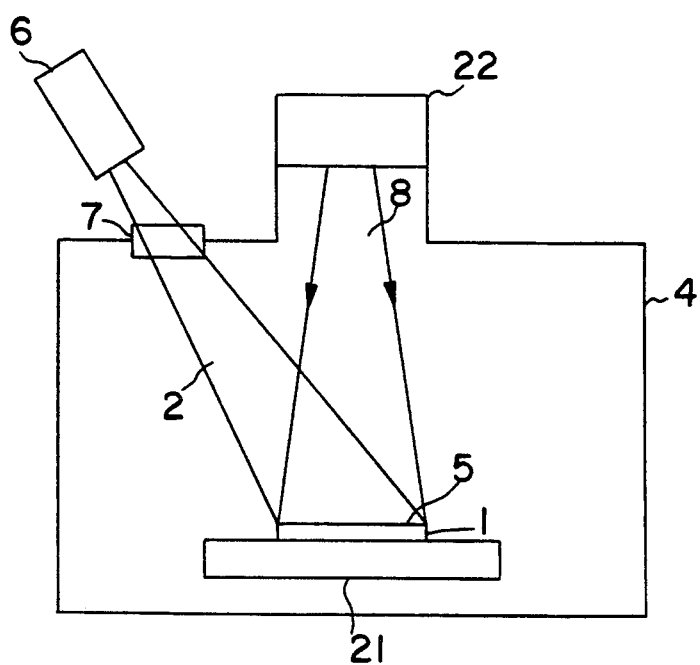
FIG. 4 shows a process in accordance with a further exemplary embodiment of the present invention.

It was further confirmed that when, as shown in FIG. 4, diamond crystal 1 was set in the vacuum chamber 4, which also included the ion source 8 for ion implantation and optical window 7 for light irradiation, and light 2 having irradiation density of more than 0.1 W/cm$^2$ was irradiated simultaneously during the ion implantation, defects in the implanted diamond crystal 1 were annihilated by light irradiation; non-diamond materials 9 created by ion implantation were removed from the surface 5 of the diamond crystal 1; dopants implanted by the ion beam 8 were activated in the diamond crystal; and semiconductor diamond was formed.

Figure 5:
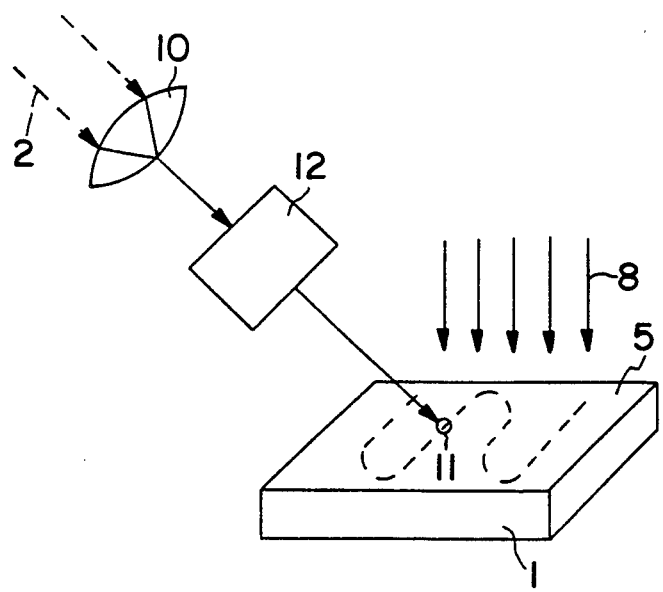
FIG. 5 shows a process in accordance with a still further exemplary embodiment of the present invention.

As shown in FIG. 3, dopant ions 8 implanted in diamond crystal 1 created defects 3 in the diamond crystal 1, and formed non-diamond materials 9 on the surface 5 of the diamond crystal 1. Irradiation with light 2 affected only the defects 3 and non-diamond materials 9 and removed them as described above. Light 2 irradiated simultaneously during the ion implantation gives its energy to a smaller amount of defects than in the case of irradiating light after the ion implantation. It is easier to remove a small amount of defects than to remove a large amount of defects. It was further confirmed that light 2 irradiated intermittently to keep the amount of implanted dopants before and between the light irradiation less than 10$^{16}$ ions/cm$^2$ was also effective to form semiconductor diamond. The same effect was experimentally confirmed in the case as shown in FIG. 5, in which irradiated light 2 was focused by the lens 10 on a small area 11 of the diamond crystal 1 and scanned to cover a large area of the diamond crystal 1 by scanner 12. This scanning technique exhibits the same effect as that of intermittent light irradiation.

It was further confirmed that ion energy of the ion implantation of the dopant in the diamond crystal was effective in the range larger than 50 eV. The ions whose energy were less than 50 eV could not penetrate into the diamond crystal lattice to become electrically active dopant and make semiconductor diamond.

The inventors further confirmed that when the irradiating light was laser light, the power of the light was stronger than that of the conventional lamp and annihilation of the defects in the diamond crystal was effective.

When the irradiated light was constituted by ultraviolet light whose wavelength was less than 400 nm, the energy of the light was absorbed by defects more efficiently than that of the longer-wavelength light. The light annihilated the defects and formed semiconductor diamond. Ultraviolent laser lights such as eximer lasers with wavelengths of 198 nm: ArF, 248 nm: KrF, and 308 nm: XeCl were the most effective lights to complete this invention. Other lights such as mercury lamp (ultraviolet and visible light) infrared heating lamp (wavelength>1 μm), Ar laser (wavelength 514.5 nm), and He-Ne laser (wavelength 632.8 nm) were also effective to complete this invention.

Figure 6:
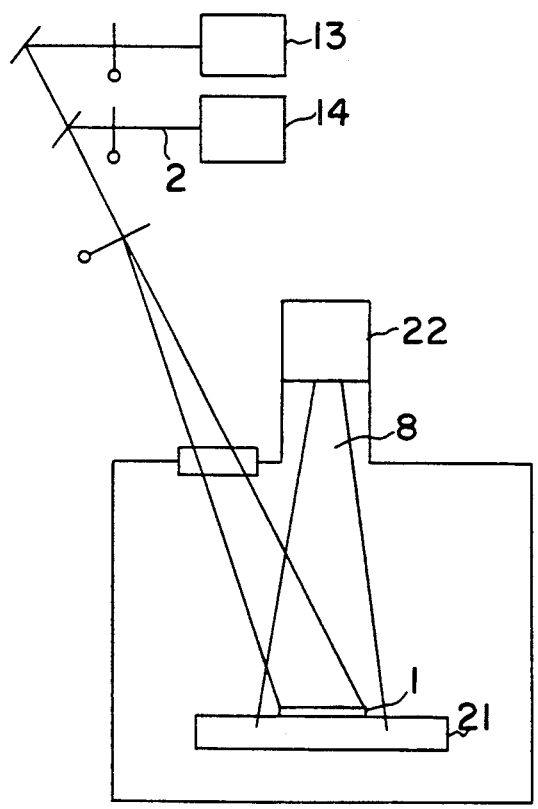
FIG. 6 is a sectional view showing an apparatus in accordance with an exemplary embodiment of the present invention.

It was also effective to irradiate light having at least two different ranges of wavelengths as shown in FIG. 6. There were two different light sources 13 and 14 (for example, eximer laser; ultraviolet light and $CO_2$ laser; and infrared light). The light, whose wavelength is longer, exhibited a longer penetration depth into the diamond crystal lattice. The penetration depth of the light coincides with the effective depth for annihilation of the defects. The light which had at least two different wavelengths exhibited two different effective depths for annihilation of the defects. It was effective to select a few wavelengths for managing the depth profile of the effective depth for annihilation and forming semiconductor diamond with a deep defect-free region.

It was further confirmed that when the temperature of the diamond crystal during light irradiation was kept lower than 300° C., thermal activation of the atoms in the diamond crystal lattice was kept small in comparison with the atoms around the defects; the selective activation of the atom movement around the defects was made effective; defects were annihilated, and semiconductor diamond was formed effectively. Diamond crystal 1 was kept at a temperature lower than 300° C. by cooling the substrate holder 21 (in FIG. 2) by, for example, water or liquid nitrogen.

It was effective to keep the temperature of the diamond crystal under 300° C. during the ion implantation. Low temperature during ion implantation suppressed the formation of stable defects which were hard to annihilate. Diamond crystal 1 was kept at a temperature lower than 300° C. by cooling the substrate holder 21 (in FIG. 4) by, for example, water or liquid nitrogen.

Figure 7B:
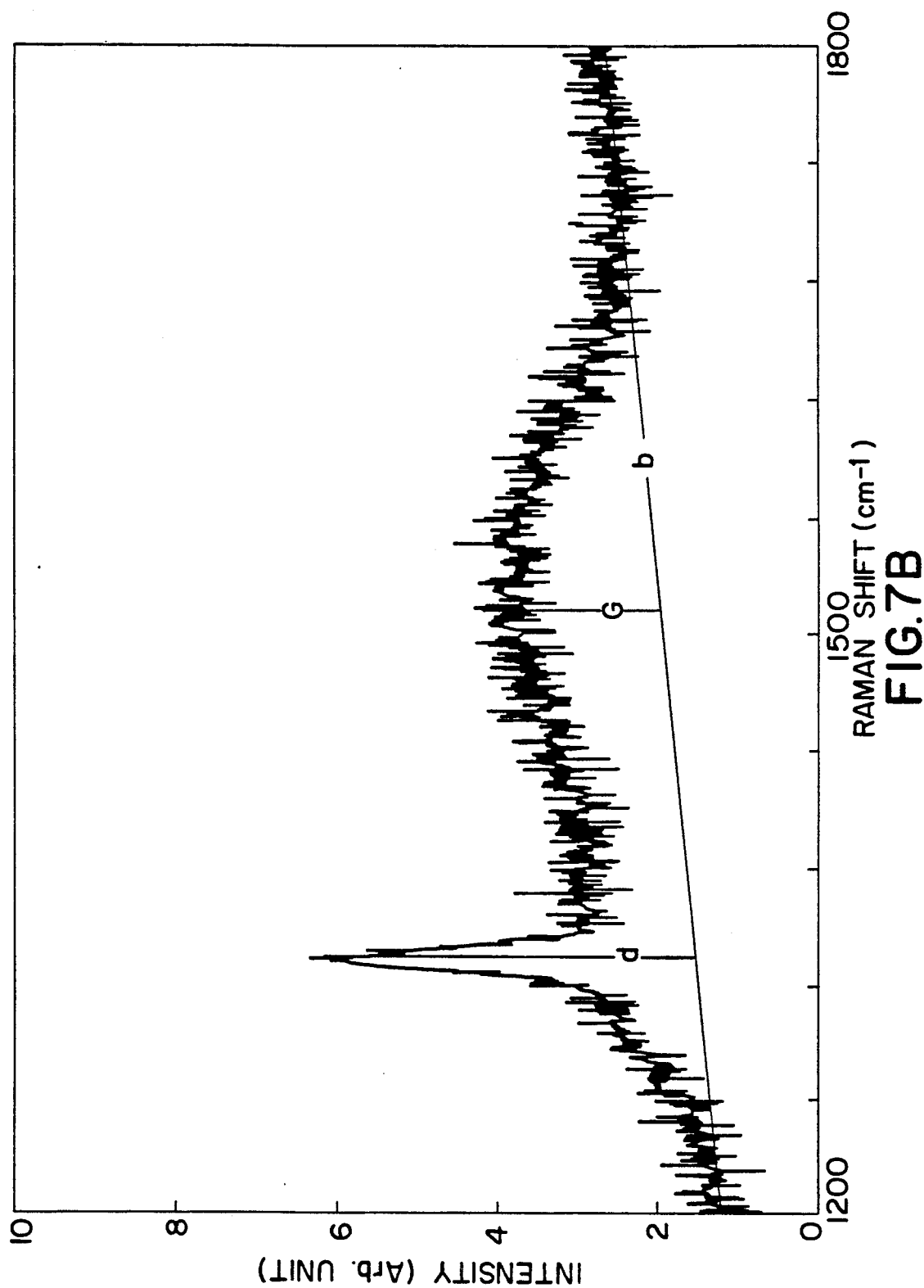
FIG. 7B illustrates Raman scattering spectroscopy of the diamond crystal thin film deposited, by micro-wave CVD after light irradiation in accordance with an exemplary embodiment of the invention.

In one example, an eximer laser having a wavelength of 308 nm, power density 400 mJ/shot, and 10 shots/s was irradiated 100 shots (10 seconds) on diamond crystal thin film synthesized by microwave-CVD on Si wafer. As shown in FIG. 2, the diamond thin film 1 was put in the vacuum chamber 4, and laser light 2 was irradiated on the diamond crystal 1 from transparent window 7. The vacuum chamber was kept at a pressure of less than $10^{-5}$ Torr, and laser light 2 was focused by a lens. The irradiation density of the light 2 was 1 $W/cm^2$ at the surface of the diamond crystal thin film 1. FIG. 7A and 7B show the Raman scattering spectroscopy by Ar laser light (wavelength 514.5 nm) of as-deposited and after-light-irradiated diamond thin film by micro-wave-CVD, respectively. The graphical representations were generated based upon the following specifications: laser power 100 mW excite wave 5145A, slit width 300 μm, full scale 1500, gate timel, repeat timel, room temperature, chamber micro, objective 10, scan increment 0.5. The background signal, the signal of diamond crystal, and the signal of graphite (or non-diamond materials) are shown as straight lines b, d, and G, respectively. The length of the line G, which represented the amount of the graphite (non-diamond materials) in the diamond crystal thin film, decreased after the light irradiation, while the length of line d did not change. This result suggested that the non-diamond materials in or on the diamond crystal were removed or annihilated by eximer light irradiation.

What is claimed is:

1. Method for formation of semiconductor diamond comprising
   irradiating diamond crystal with light having irradiation density of more than 0.1 $W/cm^2$ and less than 100 $W/cm^2$, and keeping the temperature of the diamond crystal during light irradiation at 300° C. or less,
   annihilating defects in said diamond crystals, to form said semiconductor diamond.

2. Method for formation of semiconductor diamond in accordance with claim 1, wherein
   said diamond crystal is kept in atmosphere of less than $10^{-4}$ Torr.

3. Method for formation of semiconductor diamond in accordance with claim 1, wherein
   said diamond crystal is kept in atmosphere filled with inert gas, hydrogen and/or nitrogen.

4. Method for formation of semiconductor diamond comprising:
   irradiating diamond crystal with light having irradiation density of more than 0.1 $W/cm^2$ and less than 100 $W/cm^2$, and keeping the temperature of the diamond crystal during light irradiation at 300° C. or less.
   keeping said diamond crystal in atmosphere including oxygen and
   cleaning the surface of said diamond crystal to form said semiconductor diamond.

5. Method for formation of semiconductor diamond comprising:
   implanting dopants in diamond crystal by ion implantation technique.
   then irradiating light having irradiation density of more than 0.1 $W/cm^2$ and less than 100 $W/cm^2$, and keeping the temperature of the diamond crystal during light irradiation at 300° C. or less,
   annihilating defects in diamond crystals, to form semiconductor diamond.

6. Method for formation of semiconductor diamond comprising:
   implanting dopants in diamond crystal by ion implantation technique,
   irradiating light having irradiation density of more than 0.1 $W/cm^2$ and less than 100 $W/cm^2$ simultaneously during said implantation and keeping the temperature of the diamond crystal during light irradiation at 300° C. or less,
   annihilating defects in diamond crystals to form semiconductor diamond.

7. Method for formation of semiconductor diamond in accordance with claim 6, wherein
   said irradiated light is focused on small area of said diamond crystal, and is scanned to cover large area of said diamond crystal.

8. Method for formation of semiconductor diamond comprising:

implanting dopants in diamond crystal by ion implantation technique, irradiating light irradiation density of more that 0.1 W/cm² and less that 100 W/cm² intermittently during said implantation and keeping the temperature of the diamond crystal during light irradiation at 300° C. or less, and annihilating defects in diamond crystals to form semiconductor diamond.

9. Method for formation of semiconductor diamond in accordance with claim 1, wherein said light constituted by ultraviolet light whose wavelength is less than 400 nm.

10. Method for formation of semiconductor diamond in accordance with claim 1, wherein said light is laser light.

11. Method for formation of semiconductor diamond in accordance with claim 1, wherein said light has at least two different range of wavelengths.

12. Method for formation of semiconductor diamond in accordance with claim 5 wherein dose amount of said implanted dopants before and between said light irradiation is kept less than $10^{16}$ ions/cm².

13. Method for formation of semiconductor diamond in accordance with claim 5, wherein ion energy of said implanted dopants is more than 50 eV.

14. Method for formation of semiconductor diamond in accordance with claim 5, wherein said implanted dopants include at least one material selected from the group consisting of group III and group V materials.

* * * * *